(12) United States Patent
Ivanov

(10) Patent No.: US 10,355,057 B2
(45) Date of Patent: Jul. 16, 2019

(54) OLED INTERFACE

(75) Inventor: Artem Ivanov, Gilching (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 392 days.

(21) Appl. No.: 14/112,336

(22) PCT Filed: Apr. 18, 2012

(86) PCT No.: PCT/EP2012/001675
§ 371 (c)(1),
(2), (4) Date: Dec. 8, 2014

(87) PCT Pub. No.: WO2012/143126
PCT Pub. Date: Oct. 26, 2012

(65) Prior Publication Data
US 2015/0084006 A1    Mar. 26, 2015

(30) Foreign Application Priority Data
Apr. 18, 2011 (DE) .................. 10 2011 017 383

(51) Int. Cl.
| H01L 27/32 | (2006.01) |
|---|---|
| G06F 3/041 | (2006.01) |
| G06F 3/044 | (2006.01) |

(52) U.S. Cl.
CPC ............ H01L 27/323 (2013.01); G06F 3/044 (2013.01); G06F 3/0412 (2013.01); G06F 3/0416 (2013.01)

(58) Field of Classification Search
CPC ...... G06F 3/0412; G06F 3/0416; G06F 3/044; H01L 27/323

USPC .................................................. 313/498-512
See application file for complete search history.

(56) References Cited

U.S. PATENT DOCUMENTS

| 8,487,905 | B2 | 7/2013 | Kandziora et al. | ........... 345/174 |
|---|---|---|---|---|
| 8,610,680 | B2 | 12/2013 | Chen et al. | ................... 345/173 |
| 8,629,842 | B2 | 1/2014 | Jang | .............................. 345/173 |
| 9,134,560 | B2 | 9/2015 | Hotelling et al. | |
| 2008/0036746 | A1 | 2/2008 | Klinghult | ...................... 345/176 |

(Continued)

FOREIGN PATENT DOCUMENTS

| CN | 101714047 A | 5/2010 | ............. G01D 5/24 |
|---|---|---|---|
| CN | 101859214 A | 10/2010 | ............ G06F 3/044 |

(Continued)

OTHER PUBLICATIONS

Chinese Office Action, Application No. 201280019281.4, 7 pages, dated Jan. 8, 2016.

(Continued)

*Primary Examiner* — Kevin Quarterman
(74) *Attorney, Agent, or Firm* — Slayden Grubert Beard PLLC

(57) ABSTRACT

An OLED interface has a panel layer, an anode-electrode layer, a cathode-electrode layer, an organic illuminant layer structure received between the anode-electrode layer and the cathode-electrode layer, and an evaluation circuit. The evaluation circuit is designed and connected in such a way that, together with at least the anode-electrode layer and/or the cathode electrode layer, a sensor system is produced, for detecting a finger or a hand of a user in a region upstream of the panel layer without, or before, the finger or hand touching the OLED interface or a panel element covering same.

20 Claims, 4 Drawing Sheets

(56) References Cited

U.S. PATENT DOCUMENTS

| | | | | |
|---|---|---|---|---|
| 2008/0122798 | A1 | 5/2008 | Koshiyama et al. | 345/173 |
| 2010/0066650 | A1* | 3/2010 | Lee | G02F 1/13338 345/64 |
| 2010/0110041 | A1 | 5/2010 | Jang | 345/174 |
| 2010/0123667 | A1 | 5/2010 | Kim | 345/173 |
| 2010/0164889 | A1* | 7/2010 | Hristov | G06F 3/0416 345/173 |
| 2010/0194697 | A1* | 8/2010 | Hotelling | G06F 3/0412 345/173 |
| 2010/0253630 | A1 | 10/2010 | Homma et al. | 345/168 |
| 2010/0289765 | A1* | 11/2010 | Noguchi | G02F 1/13338 345/173 |
| 2010/0321305 | A1* | 12/2010 | Chang | G06F 3/0412 345/173 |
| 2011/0128254 | A1* | 6/2011 | Teranishi | G06F 3/0412 345/174 |
| 2012/0050180 | A1* | 3/2012 | King | G06F 3/0416 345/173 |
| 2013/0194519 | A1 | 8/2013 | Ivanov | 349/12 |
| 2013/0307823 | A1* | 11/2013 | Grivna | G06F 3/0416 345/174 |

FOREIGN PATENT DOCUMENTS

| | | | | |
|---|---|---|---|---|
| CN | 102859477 | A | 1/2013 | G02F 1/133 |
| EP | 1589407 | A1 | 10/2005 | G06F 3/02 |
| JP | 2002342033 | A | 11/2002 | G06F 3/033 |
| JP | 2007534070 | A | 11/2007 | G06F 3/02 |
| JP | 2008117371 | A | 5/2008 | G06F 3/041 |
| JP | 2009258903 | A | 11/2009 | G06F 3/041 |
| JP | 2010020315 | A | 1/2010 | G06F 3/041 |
| JP | 2010231773 | A | 10/2010 | G02F 1/1333 |
| TW | 201013481 | A | 4/2010 | G06F 3/041 |
| TW | 392985 | U | 11/2010 | G06F 1/16 |
| WO | 2009/095848 | A2 | 8/2009 | H03K 17/955 |
| WO | 2009/131292 | A1 | 10/2009 | G02F 1/1333 |
| WO | 2010/009655 | A1 | 1/2010 | G06F 3/044 |
| WO | 2010/038179 | A2 | 4/2010 | H03K 17/00 |
| WO | 2010/149543 | A1 | 12/2010 | G06F 3/041 |
| WO | 2011/005977 | A2 | 1/2011 | G06F 3/041 |
| WO | 2012/143126 | A2 | 10/2012 | G06F 3/041 |

OTHER PUBLICATIONS

International Search Report and Written Opinion, Application No. PCT/EP2012/001675, 17 pages, dated Jan. 14, 2013.
Japanese Office Action, Application No. 2014505536, 13 pages, dated Apr. 8, 2016.
Chinese Office Action, Application No. 201280019281.4, 17 pages, dated Sep. 7, 2016.
Taiwan Office Action, Application No. 101113706, 15 pages, dated Jul. 19, 2016.
Japanese Office Action, Application No. 2014505536, 3 pages, dated Apr. 27, 2017.
Japanese Office Action, Application No. 2014505536, 8 pages, dated Dec. 14, 2016.
Chinese Office Action, Application No. 201280019281.4, 21 pages, dated Mar. 21, 2017.
Korean Office Action, Application No. 20137030522, 7 pages, dated Nov. 30, 2017.
Chinese Rejection Decision, Application No. 201280019281.4, 7 pages, dated Sep. 6, 2017.
Japanese Office Action, Application No. 2014505536, 9 pages, dated Sep. 19, 2017.

* cited by examiner

OLED INTERFACE

CROSS-REFERENCE TO RELATED APPLICATIONS

This application is a U.S. National Stage Application of International Application No. PCT/EP2012/001675 filed Apr. 18, 2012, which designates the United States of America, and claims priority to DE Patent Application No. 10 2011 017 383.8 filed Apr. 18, 2011. The contents of which are hereby incorporated by reference in their entirety.

TECHNICAL FIELD

The invention relates to an OLED interface, which may be used in display devices, in particular in those of mobile communications devices, as well as a background illumination structure of switching function interaction zones in electrical devices, for example backlit operating screens.

BACKGROUND

OLEDs so far used as illumination means typically are constructed of several organic layers. Mostly, a hole transport layer (HTL) is applied to the anode consisting of indium tin oxide (ITO) that is arranged on a glass pane. Between ITO and HTL, depending on the manufacturing method, often a layer of PEDOT/PSS (Poly(3,4-ethylendioxythiophen)/Polystyrolsulfonate) is applied that serves for reducing the injection barrier for holes and prevents the diffusion of indium into the junction. A layer is applied to the HTL, which either comprises a pigment (about 5-10%) or—seldom—completely consists of the pigment (for example Aluminium-tris(8-hydroxychinolin), Alq3). This layer is called a emitter layer (EL). Then, thereto an electron transport layer (ETL) is applied. Finally, a cathode, consisting of a metal or an alloy comprising low electron work function as for example calcium, aluminum, barium, ruthenium, magnesia silver alloy is evaporated under high vacuum. As a protective layer and for reducing the injection barrier for electrons between cathode and ETL often a very thin layer of lithium fluoride, cesium fluoride or silver is evaporated. The electrons (=negative charge) are injected by the cathode while the anode provides the holes (=positive charge). Hole and electron drift towards each other and in an ideal case meet each other in the EL, therefore this layer also is called recombination layer. Electrons and holes constitute a bound state that is called exciton. Depending on the mechanism the exciton already constitutes the excited state of the pigment molecule, or the decay of the exciton provides the energy for the excitation of the pigment molecule. This pigment has different excitation states. The excited state may transit to the basic state and send a photon thereby. The color of the emitted light depends on the energy distance between excited and basic state and may be changed by varying the pigment molecules. Until now non-emitting triplet states constitute a problem. These may be released by means of adding so called excitors. The abbreviation PLED (polymer light emitting diode) for organic LEDs manufactured from polymers has been enforced. OLEDs manufactured form small molecules are called SOLED or also SMOLED. Often derivatives of Poly(p-Phenylen-Vinylen) (PPV) are used as pigments in PLEDs. Lately pigment molecules are used which lead to expect a four times higher efficiency as when using the above described fluorescent molecules. In these more efficient OLEDs metal-organic complexes are used in which the light emission is carried out from triplet states. These molecules also are called triplet emitters; the pigment may also be excited by light, which may lead to luminescence. Today it is the goal to produce self-illuminating displays, which use the organic electroluminescence. An advantage of OLED displays as compared to state of the art liquid crystal displays is the very high contrast since they do not need backlighting: while LCDs only act as colored filters, OLEDs emit colored light. This method is much more efficient, whereby OLEDs consume less energy. For this reason OLED television devices become less warm than LC displays in which a major part of the energy required for backlighting is transferred into heat. As a result of the reduced energy consumption OLEDs can be well utilized in small portable devices, for example in notebooks, cell phones and MP3 players. Because of the backlighting not being required it is feasible to design OLEDs very thin. OLED displays and OLED television devices also have advantages as compared to contemporary LCD and plasma devices in the area of shipping based on the lower volume and the lower weight. Further, known from a publication of the Fraunhofer institute is to design an OLED panel such that it may be switched on and off by touching it.

SUMMARY

According to various embodiments, solutions can be provided by which in connection with OLED structures an interaction zone may be realized which provides particularly advantageous interaction functions.

According to a specific embodiment, an OLED interface may comprise:
a panel layer,
an anode-electrode layer,
a cathode-electrode layer,
an organic illuminant layer structure that is arranged between the anode-electrode layer and the cathode-electrode layer, and
an interpretation circuitry,
wherein the interpretation circuitry is formed such that in interaction with at least the anode-electrode layer and/or the cathode-electrode layer it realizes a sensor system for the detection of a finger or a hand of a user in an area in front of the panel layer without or before the user touches the OLED interface or a panel element covering the OLED interface.

Thus, a user interface is realized in connection with an OLED structure which allows to detect the movement of a finger or a hand of a user in an area in front of the OLED structure by means of electro-static or electric field effects and in this connection to use at least one electrode system of the OLED structure. The position or movement information detected via the interpretation circuitry may be used for producing mouse control signals, or for producing other switching and control signals.

In particular, it is feasible by means of the spatial detection of the movement or the position of a finger of the user with respect to the OLED structure to also carry out control actions, which directly relate to the function of the OLED structure. Thus, the detected movement may be used to detect gestures, which coordinate switching on, switching off and a brightness control without a necessity to physically touch the OLED structure or a equipment accommodating it.

In connection with a LCD or TFT structure the OLED structure may form a display device. It is feasible to use one of the electrode layers of the OLED structure—preferably the anode-electrode layer—as VCOM-electrode of the LCD or TFT structure.

According to a special aspect the anode-electrode layer, the cathode-electrode layer, or—in a combination of the OLED structure with a TFT structure—a further electrode layer provided on the TFT structure and in this connection on a side averted from the OLED structure is subdivided into a plurality of electrode segments such that these electrode segments in this connection form a segment array that comprises segment rows and segment columns. The interpretation circuitry is coupled with the electrode segments and formed such that it may adopt a circuitry state in which at contact a position detection is carried out via the electrode segments of the electrode layer, and further may adopt a circuitry state in which the contactless position or movement detection of a finger of the user may be carried out in an area in front of the OLED structure.

The interpretation circuitry further may be designed such that by means of this a part of that electrode segments, which are used for the detection of the position of the finger of the user in contact mode, also are used for the detection in the non-contact mode, wherein the contactless position or movement detection is carried out in that several electrode segments of the segment array are combined into an electrode group.

Thereby it is feasible in an advantageous manner to realize a display device in connection with the OLED structure, wherein at least a part of the electrodes of the OLED structure are used for realizing a sensor system which serves a detection of the spatial positions or movements of the hand or of the finger of a user in relation to the OLED structure.

The electrode segments temporarily may be operated as an electrode system by means of which a detection of the position or movement of a finger of the user is carried out before he/she touches the OLED structure. As soon as a contact to the OLED structure or to a physical component of a display or illumination device comprising the OLED structure is carried out, by means of directly adjoining electrode segments or adjoining electrode segments of rows and columns crossing each other a position analysis may be carried out in the touch mode. The electrode group preferably comprises electrode segments that form an elongated chain in the OLED interface. The chains used for the detection of the position of the finger in the non-touch mode preferably extend relatively close along the edge regions of the OLED structure or of the display device comprising the OLED structure. The segment chains temporarily operated as sensor electrode systems for position or movement detection may have different orientations with respect to each other, in particular the may be parallel and spaced with respect to each other. Also, interpretation results may be introduced into the position detection, which are based on detection events, which are derived from electrode segment chains that are oriented in a transverse manner with respect to each other, in particular are perpendicular with respect to each other.

The detection of the position of a finger at a contact with the OLED structure or a display device comprising the OLED structure may be carried out in that the electric field coupling of two directly adjoining electrode segments is detected and evaluated. In order to detect this short electric field coupling of the adjoining electrode segments the segment array preferably is designed such that a first part of the electrode segments is combined into separate segment rows and a second part is combined into separate segment columns. The segment rows and the segment columns are isolated against each other. The connection paths between consecutive electrode segments of the respective electrode segment row are isolated against the connecting ligaments of the consecutive electrode segments of the segment columns. The respective crossover points are formed as isolating bridges by means of which a galvanic connection of these connecting ligaments in the crossover segment is prevented. Preferably, the electrode array is formed in the manner of a field comprising closely adjoining rhombi, hexagons, polygons or other or other close meshed adjoining allotments. Therefore, located adjacent to an electrode segment, which constitutes a part of a segment column, in direct neighborhood is an electrode segment, which forms part of a segment row. The point of contact to the OLED structure or to a display comprising that OLED structure thereby correlates to the crossover point of that segment row and that segment column which causes the highest capacitive coupling. In the contact detection mode, the determination of the X and Y positions thus is carried out by detecting the crossover points comprising high capacitive coupling. The point of contact in the touch mode further also may be detected by determining which segment row and which segment column have the highest capacitive coupling with the finger of the user. The contact position then relates to the crossover point of this segment row with that segment column. However, in the non-touch mode the detection of the X and Y positions is carried out in that for the capacitive coupling of several segment columns and several segment rows respective position dependent signal levels are detected which are indicative for the distance of the finger from the respective segment row and the respective segment column. From these level values then the position of the finger may be calculated, or at least the path of movement of the finger may be described. Preferably, this calculation is carried out by processing several basic approaches, preferably weighted amongst each other, for example triangulation and trilateration approaches matched to different electrode segment groups and group combinations. At first, the capacitive coupling with respect to ground, or another voltage coupling across the segment rows and segment columns is detected as an analog value. This analog level then is converted by means of an ADC system and subjected to a digital data processing.

According to an embodiment, with a substantially rectangular OLED structure or a display device comprising the OLED structure, the determination of position or movement in the non-touch mode is carried out using segment rows and segment columns located closely to the edge regions. These segment rows and segment columns located closely to the edge regions form an electrode frame. This electrode frame allows for determining the X position of the finger of a user by means of interpretation of the capacitive finger induced coupling of the segment columns located closely to the edge regions against ground or against an electric potential of an electrode of the OLED structure. The Y position of the finger may be determined by means of finger induced capacitive coupling of the upper and the lower horizontal segment row against ground or against an electric potential of an electrode of the OLED structure. The electric potential opposite to ground preferably is applied to the electrode layer of the OLED structure acting as an anode electrode, which substantially extends across the full area on a backside of the plane layer averted to the user, i.e. across the backside of the electrode segment array averted to the user.

Preferably, the switchover between a first circuitry state and a second circuitry state is carried out by means of a multiplexer device. This multiplexer device may be designed as a time-division multiplexer device which reserves a certain time phase for the non-touch mode and a certain time phase for the touch mode. If applicable, certain groups of electrode segments in a program controlled manner and continuously also may be used as electrode segment chains for the position and movement detection in the non-touch mode and in parallel certain electrode segment chains may be used for a two dimensional position detection in the touch mode. The user interface then preferably is designed such that it does not require a touch detection function for that areas whose electrode segment chains are used for non-touch position detection.

Touch detection mode and non-touch detection modes may be carried out consecutively by means of circuitry-wise methods, or may be carried out simultaneously.

With consecutive enabling, instead of a fixed definition of the period of the respective mode, the changeover between the respective modes may be adjusted such that, for example, the portion of the cycle for adopting the second operating state (of the non-touch mode) is set to zero, or is reduced, as long as a contact is detected. Preferably, a contact is detected, when the capacitive coupling of an electrode segment row and an electrode segment column to each other, or in each case against ground, exceeds a particular limit. By suppressing the non-touch analysis mode the signal processing may be simplified, since the signal interpretation in the touch mode may be carried out using less sensitivity and simpler interpretation operations than in the non-touch mode. Analogously, in an advantageous manner the portion of the cycle for adopting the first operation state is reduced as long as no contact is detected. Since the contact event can be detected particularly reliable, however, preferably even then, when for example no approach fulfilling a contact indicative of a limit criterion is detected, in certain, however preferably relatively large time distances a contact detection is carried out in order to achieve hereby a gain in functional safety.

In a preferable manner the non-touch mode may be subdivided into at least two sub-modes. The first sub-mode is a large distance mode. In this, for example, only a wake-up function and a coarse detection of a Z-axis distance (a distance substantially perpendicular to the display) are determined. Only when falling below a minimum distance in Z-direction, the processing of a second sub-mode is carried out. In this a more sensitive position detection is carried out by means of interpretation of the coupling of the electrode group constituted by the electrode segments against ground or by means of interpretation of a field coupled into this electrode group. The distance limit, where an underrun leads to a detection of the X, Y and Z position for example corresponds to a distance at which the segment rows and segment columns located closely to the edge regions already allow for a sufficiently precise position detection. According to experimental examinations these conditions are given on a regular basis when the distance of the finger from the display is smaller than about ⅔ of the diagonal measure of the display.

In the context of the second switching state different electrode segment groups may be enabled consecutively when a minimum distance is underrun. The electrode segment rows and electrode segment columns used for position detection in the non-touch mode therefore may "migrate" on the display and thus may adopt optimized detection positions for the respective finger position. Also, several electrode segment rows and electrode segment columns may be enabled and interpreted concurrently. The electrode segment groups enabled concurrently may be rows or columns spaced from each other, or also rows and columns extending transverse to each other. For medium distances, i.e. distances from 25% to 50% of the display diagonal, the position of the finger may be determined by triangulation and trilateration, in particular by interpretation of the analog signal levels of the segment rows and segment columns located closely to the edge regions. During further approach the position of the finger may be determined as the crossover point of the segment column and segment row comprising the highest capacitive coupling against ground, or from other significant electric potentials, preferably from OLED-electrodes. The Z distance then may be determined from the respective level of the capacitive coupling against ground or the level of the electric potential. The concept of the crossover point and the concept of trilateration also may be used jointly together for the position detection, in particular weighted in a linked manner.

Preferably, in the second switching state, i.e. the non-touch mode, a first electrode group is enabled which constitutes an upper horizontal segment chain located closely to the edge region and a second electrode group is enabled, which constitutes a horizontal segment chain located closely to the edge region. Then, the Y position of the finger located between these horizontal borders may be calculated by means of these two electrode segment groups.

For the detection of the X position in the second switching state (non-touch mode) preferably electrode groups are used, which constitute a left vertical segment chain located closely to the edge region and a right vertical segment chain located closely to the edge region.

Furthermore it is feasible to use consecutively alternating electrode groups for the detection of the position of the fingers so that, for example, the respective interpreted electrode segment groups migrate across the OLED interface, in particular across the OLED display, in the manner of an adaptively switched, for example vertically migrating row or horizontally migrating column.

Furthermore, the level values of electrode segment chains aligned transverse to each other, in particular extending about perpendicular to each other, may be interpreted by means of respective interpretation concepts.

The detection of the X, Y and Z information preferably is carried out, as already mentioned in the context of the second switching state (non-touch mode), by forming electrode groups and by detecting the coupling of these electrode groups against ground. This respective coupling closely correlates with the distance of the finger from the respective electrode group. From the respective coupling values against ground, or by means of another coupling of electric potential caused by the finger of the user and correlating with the distance of the finger, then the distance from the respective electrode group may be determined and the position of the finger may be detected from the different distance values.

As an example the interpretation circuitry may be designed as an ASIC and may be located in direct proximity of the panel layer of the OLED structure. The connection of the interpretation circuitry to the discrete conductor paths of the electrode segments for example may be carried out by means of a flexible conductor path, by means of clip contact structures or by means of direct arrangement of the ASIC on the panel layer. The electrode segments arranged on the panel layer are connected to the ASIC via conductor path segments. Already in the region of the panel layer vertically sequential and horizontally sequential electrode segments may be combined into electrode rows and electrode columns, wherein these columns and rows are isolated against each other and each are connected to the ASIC or to a multiplexer. as an electrode segment group Preferably, the electrode segments are designed as circular disks, as rhombi, hexagons, octagons, new moon like structures or closely adjoining other polygons, or partly have intermeshing geometries. When designed as respective segments, in particular as rhombi, rhomb chains may be formed. A part of the rhombi is used to form horizontal rhomb chains, the remaining part of the rhombi is used to form vertical rhomb chains. Between the electrode segments run small division gaps which prevent a galvanic contact of the segments of an electrode segment row with the electrode segments of the crossing electrode segment columns. The electrode segments therefore are formed in a closely arranged manner, wherein only the electrode segments are connected to each other in a conductive manner that form a row-like or column-like chain.

Preferably, the ASIC internally is designed such that it sets the connections of the electrode segment rows and electrode segment columns such that it may be used for processing the touch mode as well as for processing the non-touch mode. Preferably, a setting is provided in the ASIC which allows for certain system characteristics of the electrode groups as well as transition phenomena when changing between the operational modes, or the change of the group structure, to be considered.

In particular for devices that may be held single-handed, as for example cell phones, in the context of signal processing it is possible to carry out a calibration routine by means of which at first an influence to the field caused by holding the device is compensated at least to a large extent. The gesture detection in the non-touch mode at first may require a certain gesture, for example a movement of the fingertip along a virtual circular path in clockwise direction, which is carried out in front of the display in a distance of about 66% of the diagonal of the display. By means of this special gesture the non-touch detection mode may be enabled and furthermore a calibration of the sensor system may be carried out.

Preferably, a view correlating with the detected position is carried out via the user interface. The transition of certain windows or menu items in the graphical user interface may be communicated acoustically, and preferably by means of a mechanical feedback, for example an electro-magnetically shifted mass element, may also become haptic.

In cases where an approach of the finger also leads to a contact with the OLED display, the positions determined during the non-touch approach phase may be compared to the point of contact later detected in the touch mode. With the help of information at first determined during the non-touch phase and via the position information determined extremely reliable in the touch mode the interpretation parameters for consecutive detection events may be adapted by means of an internally implemented calibration procedure. The same is true for lifting the finger away from the display device. For the position detection in the non-touch mode, a fine automatic internal adjustment may be carried out here by means of respective modification of internal parameters on the basis of the last definitely determined point of contact.

In particular in relatively small touchscreens the position detection may be carried out such that with a larger distance of the finger from the display device the detection range for the detection of the position of the finger has larger dimensions than the display device.

The processing of X and Y positions, in particular in Y direction, may be carried out such that an offset is generated here which results in that the cursor currently positioned on the display or the selected menu item are not covered by the finger of the user.

In the context of the present description, to be understood as a display contact is a soft contact of the finger onto an OLED panel structure, in particular onto a display panel. In this connection, the electrode systems integrated into the OLED interface are not contacted, or at least not required to be contacted in a galvanic manner. Here, the finger contacts an isolating panel or film or foil element. Typically, all electrode systems provided in the OLED interface are covered by an isolating transparent glass or plastic layer. The contacting state may be detected by means of sufficiently indicative signal levels for this state. The contacting state and the non-contacting state also may be detected by means of specific dynamic characteristics indicative for the distance to the Z axis. Typically, when touching down the finger the Z dynamics is close to zero or represents the flattening of the fingertip during an increase of pressure. This phenomenon may be used as an indicator for a selection. Also, in the non-touch mode the Z dynamics or certain Z dynamics criteria may be used as an indicator for a selection. For example, a Z dynamics criterion may be defined such that it is fulfilled during a quick downward movement and again upward movement of the fingertip along a short distance about perpendicular to the display. This Z dynamics criterion then describes a "virtual mouse click".

Depending on if a touch-mode or a non-touch mode is enabled the user interface may vary and in this connection have characteristics which provide specific handling advantages for the respective mode. For example, in the non-touch mode a coarser graphical menu item structure or a reduced cursor dynamics may be provided than in the touch mode.

On the basis of the concept according to various embodiments it is also feasible to activate the respective transverse and longitudinally oriented electrode segment chains such that a multi-point detection, in particular a detection of two fingers is allowed for thereby. To do so, for example, several zones may be generated, each of which provides values for finger positions. The enabling of this multi-point detection mode may depend on the fulfillment of certain distance criteria, or also depend on certain initially required trajectory courses, i.e. gestures. In the context of a multi-point detection mode advantageously intuitive interactions that can be coordinated, as for example scaling operations, rotations of image content and drag and drop actions may be coordinated without the display being touched in this connection.

According to a further embodiment a backlit touchpad component comprises a support layer, an OLED structure and an electrode layer, which is connected to the support layer. The electrode layer is subdivided into a plurality of electrode segments, wherein these electrode segments form a segment array, which comprises segment rows and segment columns. The touchpad component illuminated by the OLED structure further comprises an interpretation circuitry that is designed such that it may adopt a circuitry state in which a contact detection is carried out by means of the electrode segments of the electrode layer. In addition, the interpretation circuitry allows for adopting a circuitry state in which a contactless position or movement detection of a finger of the user may be carried out in an area in front of the touchpad component. The contactless position or movement detection is carried out with a combination of several electrode segments of the segment array into a row-like or column-like electrode segment group. This touchpad component constructional may be designed as previously described with respect to the display device. This touchpad component may be used to realize touchpads, which in addition allow for a contactless position detection. Such touchpads may be integrated at integration locations for touchpads so far conventional, for example in notebooks. The structure according to various embodiments for combined detection of finger positions in the touch mode as well as also in the non-touch mode may also be integrated into other devices, in particular furniture and vehicle interiors in order to realize here in a spatially restricted area a respective input zone, i.e. an input zone which also allows for non-touch interactions.

BRIEF DESCRIPTION OF THE DRAWINGS

Further details and characteristics of the invention result from the following description in conjunction with the drawing.

DETAILED DESCRIPTION

Figure 1:
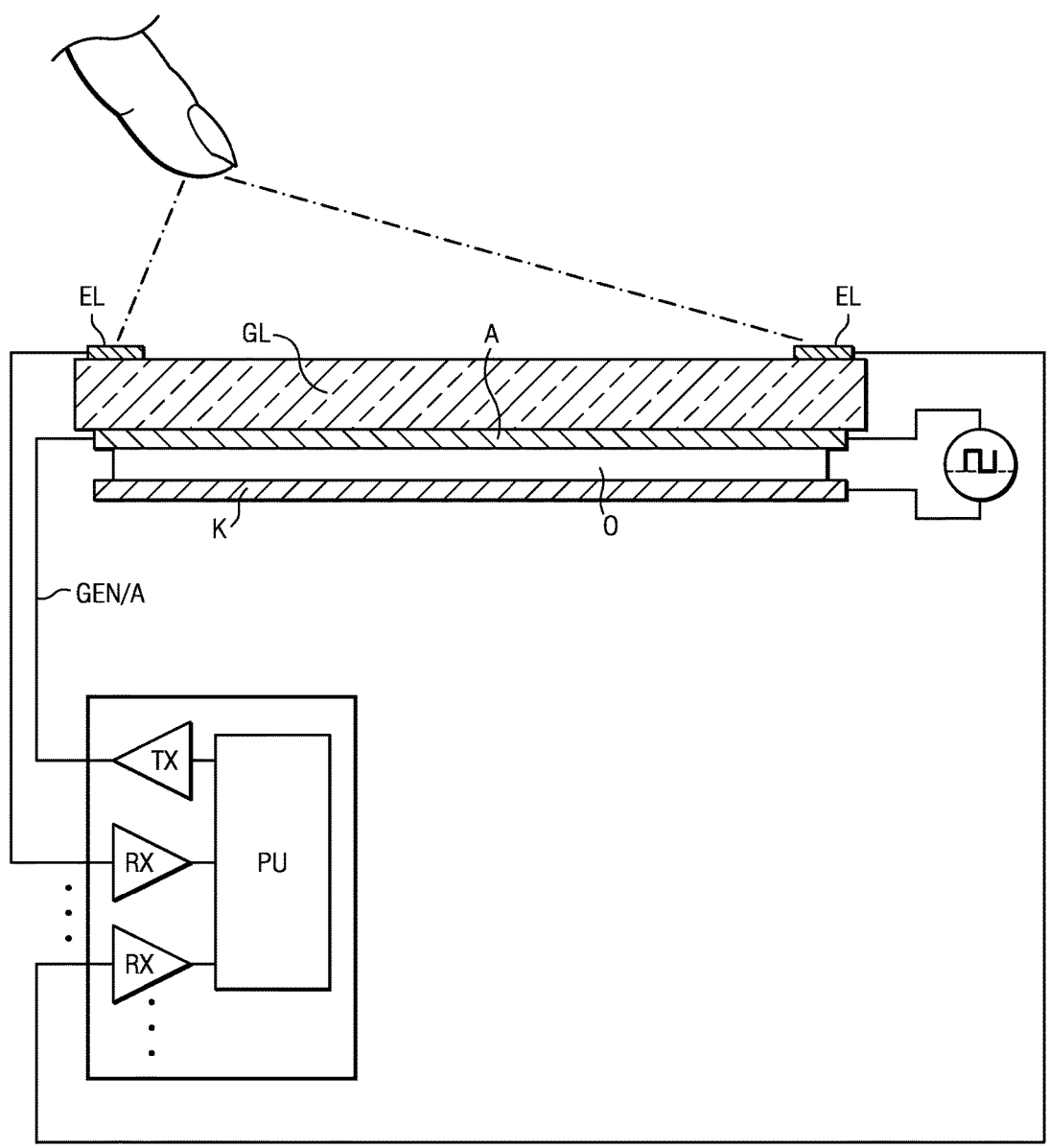
FIG. 1 shows a schematic view for illustrating the design of an illuminated position sensor device according to various embodiments formed comprising an OLED structure.

FIG. 1 schematically and strongly simplified shows the cross-section of an OLED interface according to various embodiments. It comprises a panel layer GL, an anode-electrode layer A, a cathode-electrode layer K, and an organic illuminant layer structure O which is accommodated between the anode-electrode layer A and the cathode-electrode layer K.

The OLED interface further comprises an interpretation circuitry PU. The interpretation circuitry PU is formed such that in interaction with at least the anode-electrode layer A and/or the cathode-electrode layer K (shown here is the embodiment comprising an anode layer) a sensor system for the detection of a finger F or a hand of a user is realized in an area in front of the panel layer GL before or without the user touching the OLED device or a panel element covering the OLED device.

As already described above it becomes feasible to realize a user interface, by means of the illustrated design in connection with an OLED structure, which allows for detecting the movement of a finger F or of a hand of a user in an area in front of the OLED structure by means of electrostatic or electric field effects and in this connection to utilize the electrodes of the OLED structure. In the example shown here, a square-wave generator carries out the voltage supply of the OLED structure. By means of pulse width modulation the illumination intensity may be adjusted. The operation of the OLED structure using alternating DC voltage allows for a particularly advantageous operation mode of the position sensor system realized including the anode electrode A. In this manner, for example for each voltage cycle or for a selected number of voltage cycles the coupling of electric potential, capacitive coupling against ground, or the capacitive coupling against the potential of one of electrodes A, K of the OLED structure may be detected. These voltage levels are determined for the respective sensor electrode EL and are used for the calculation of the position of the finger.

Figure 2:
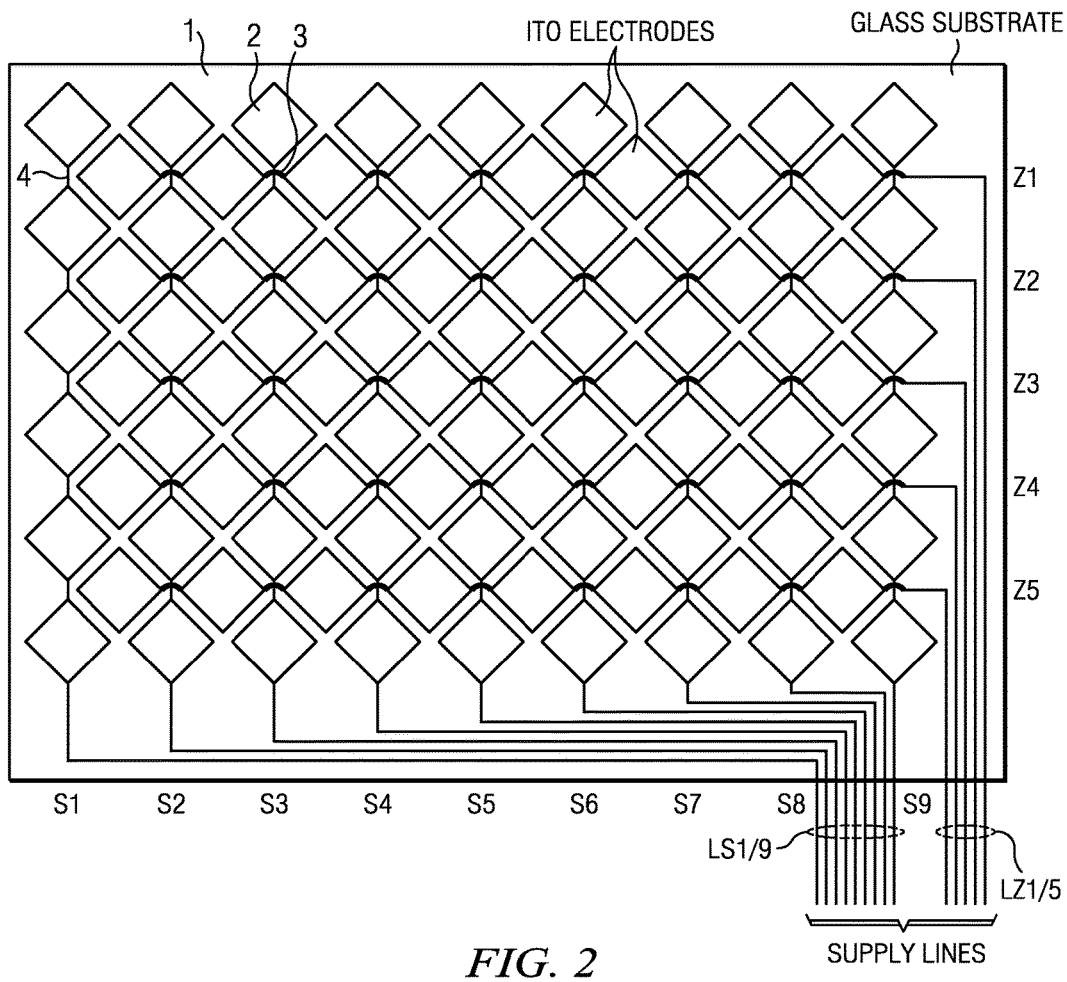
FIG. 2 shows a schematic view for illustrating the design of a illuminated input device realized in connection with an OLED structure comprising arraylike arranged electrode segments, which are used for contact detection as well as for finger position detection in the non-touch mode.

FIG. 2 strongly simplified shows a specific application case of the OLED interface technique according to various embodiments in a display device. This display device comprises a panel layer 1 that is made of a transparent and isolating material. Applied to this panel layer 1 is a transparent electrode layer, which is connected to the panel layer 1. This electrode layer is subdivided into a plurality of electrode segments 2. The collective of all electrode segments 2 forms the segment array that can be seen here. This segment array forms segment rows Z1, Z2, Z3, Z4 and Z5 as well as segment columns S1, S2 . . . S9 as the respective horizontally as well as the vertically consecutively adjoining segments 2 are connected to each other by means of connection conductor segments 3, 4. The segment rows Z1 . . . Z5 and the segment columns S1 . . . S9 are isolated against each other and each provided with a conductor LZ1/5 and LS1/9 discretely routed across the panel layer. Provided they cross each other in the area of the display the connection conductor segments 3, 4 also are isolated against each other.

Via these supply lines LZ1/5 and LS1/9 the segment columns and segment rows are connected to an interpretation circuitry not shown here in detail. This interpretation circuitry is formed such that it may adopt a first circuitry state, in which a contact detection is carried out by means of the electrode segments of the electrode layer, and may adopt a second circuitry state, in which the contactless position detection of a finger of the user may be carried out in an area in front of the display device, wherein the contactless position detection is carried out combining several electrode segments 2 of the segment array into an electrode group, in particular electrode row Z1 . . . Z5 or electrode column S1 . . . S9. The electrode segments 2 or the electrode segment chains formed therefrom functionally substantially correspond to the sensor electrodes EL shown in FIG. 1.

Figure 3:
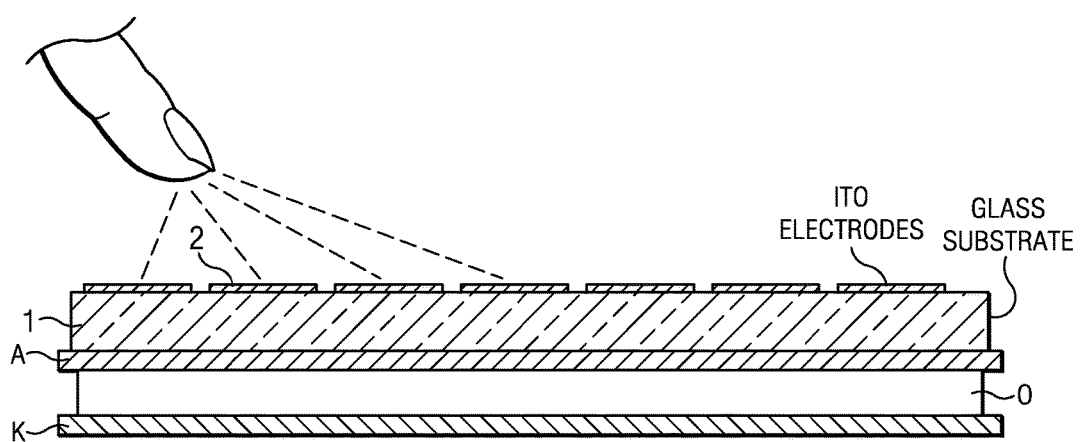
FIG. 3 shows a cross-sectional view for further illustrating the design of the illuminated input device of FIG. 1.

Shown in FIG. 3 in a strongly simplified manner is the design of the OLED interface according to FIG. 2. The panel layer 1 preferably consists of a plastic or glass material and has a thickness of for example 0.8 mm. On both sides on the panel layer 1 each a transparent conductive coating (for example an ITO coating) is provided. One of these layers acts as an electrode of the OLED structure O. Preferably, the anode-electrode layer A is arranged between the electrode array comprising the electrode segments 2 and the cathode-electrode layer.

The upper side facing to a user in the built-in and application position has a structured layer subdivided into a plurality of segments 2, which in this connection as shown in FIG. 2 have closely adjoining segments, for example rhombi, which are segmented in rows and columns. The electric bonding of the electrode segments grouped into rows and columns is carried out by means of dedicated supply lines. The electrode acting as the anode-electrode A of the OLED structure O is formed as a continuous transparent ITO-layer. The panel structure designed such forms a self-illuminating panel element, which may act as self-illuminating touchpad and as interface for contactless input operations. The electrode layers are covered by further transparent isolating layers not shown here, and therefore in particular from the side of the user cannot be contacted directly in a galvanic manner.

Figure 4:
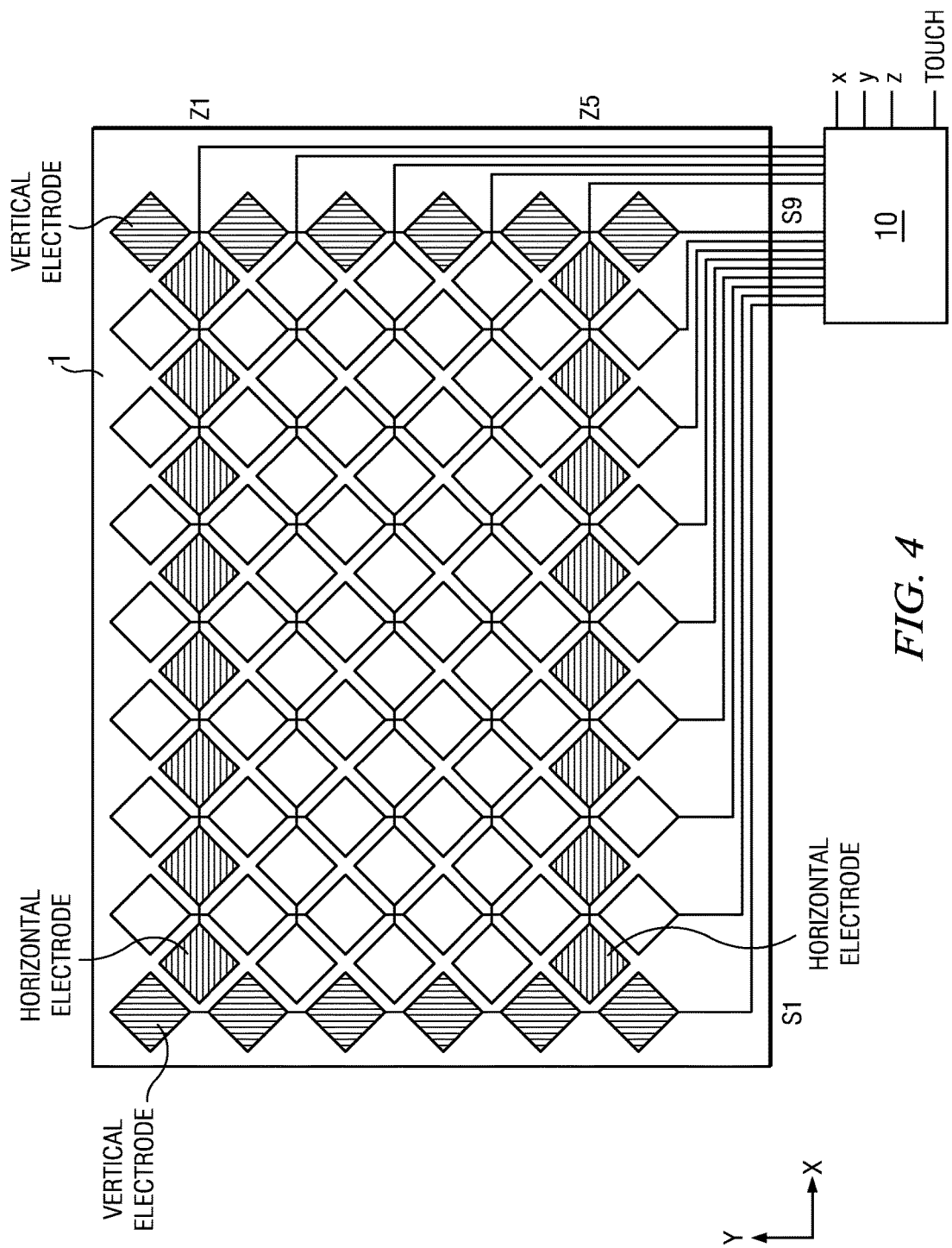
FIG. 4 shows a schematic representation for illustrating the forming of two horizontal and two vertical electrode segment groups in one electrode segment array that temporarily are used as field electrodes for detecting a position of a finger.

As shown in FIG. 4, in the exemplary embodiment represented here, in a respective switching state four of the rhomb chains located closely to the edge region, i.e. the segment rows Z1 and Z5 formed by horizontal combination of electrode segments 2 as well as the segment columns S1 and S9 formed by vertical combination of the electrode segments 2 located closely to the edge region are used for a finger position or finger movement detection on the glass. Thereby, using the electrode segments grouped into rows and columns, a "frame" comprising gesture detection electrodes is constructed.

The upper horizontal electrode segment group Z1 and the lower horizontal electrode segment group Z2, as well as the two left and right electrode segment columns S1 and S9 located close to the edge, which are used for finger position detection in the non-touch mode, here are highlighted by crosshatching. The two horizontal electrode segment groups Z1 and Z5 are used for the detection of a Y position of the finger of a user. Simultaneously with or where applicable also directly after the detection of the Y position by means of these two electrode segment groups Z1 and Z5 an interpretation may be carried out by means of which via the electrode segment column S1 in the left edge region a left elongated detection electrode is formed (left vertical rhomb chain) and by means of interconnection of the electrode segments in the right edge region a right electrode segment column S9 (right vertical rhomb chain) is formed. By means of these two electrode groups then the X position of the approached finger may be determined. Furthermore, the distance of the finger to the OLED interface may be determined from the measurement signals. In order to determine the X and Y positions the signal levels detected by the row-like and column-like electrode segment groups also may be determined on the basis of other interpretation concepts. In particular, also electrode segment groups oriented transverse with respect to each other may be utilized for the X and Y position detection. For determining the X and Y positions different interpretation concepts may be accumulated in a weighted manner.

In a device having a respective OLED interface the positioning of the hand or of a finger may be detected beginning with the underrun of a certain distance before it touches the OLED interface. As soon as the finger of the user touches the OLED interface a state of the art touchpad function is provided by using the electrode segments 2.

It is feasible to provide further electrodes in the area of the OLED interface that, for example, only serve to support the position detection in the "non-touch mode". By means of these additional electrodes, for example, the detection of the presence of a hand may be carried out in a larger distance. Switching to an operation mode in which the touch analysis electrodes are used as position detection electrodes for contactless position detection then, for example, only is carried out when a certain minimum distance is underrun. Carrying out a position detection of fingers before these touch the OLED interface may be suppressed as soon as a contact to the OLED interface was detected. Furthermore, the interpretation of the electrode segments in contact mode may be suppressed as long as a certain minimum distance not yet is underrun.

The finger position detection mode without touching (non-touch or GestIC mode) and the position of the finger detection mode comprising interface contact (touch mode) may each be activated by means of a multiplexer, in particular a time division multiplexer. The GestIC mode may include the usage of a group driver provided for the selection of the respective electrode group, wherein bay means of this group driver it is determined which electrode segment group, or where applicable even which single electrode segments are currently used for the detection of the position of the finger in the non-touch mode. The group driver may forward the information related with the current electrode segment group to a compensation circuitry which defines certain parameters or preselections and defines reference level values which are used in the interpretation of the electric field phenomena detected by the respective electrode segment group. These parameters in particular may define the overall capacity or normal grounding of the currently active electrode system in an uninfluenced state and thereby may cause a certain pre-calibration.

The circuitry for temporarily activating the electrode segment rows and electrode segment columns, as well as the interpretation of the electric field neighborhood state detected by means of the activated electrode segment groups in an advantageous manner may be implemented in an ASIC 10 which preferably is arranged in direct proximity of the panel layer 1, in particular is connected to the panel layer 1. This ASIC 10 is preferably formed such that besides the detection of the position of the finger in the non-touch mode it also provides the interpretation in the touch mode, i.e. the touchscreen functionality. This ASIC 10 preferably is designed such that certain functions may be defined by programming. The ASIC may be designed such that it determines which electrode segment groups, in particular which electrode segment rows Z1 . . . Z5 and electrode segment columns S1 . . . S9 of the electrode segment array are currently used for the position detection in the non-touch mode.

The ASIC 10 itself provides the signals relating to the X and Y position as well as of the touching state in the manner of common touchscreen circuitry. In addition, the ASIC 10 also provides the Z position or signals, which provide conclusions about the distance of the finger of a user from the display before it is touched. A background program may be processed in the ASIC, which carries out a certain pre-interpretation of the detected position or movement information. In particular, in this manner also "mouse click information" may be produced by the ASIC. The ASIC 10 uses the electrode segments 2 provided for the X and Y position detection in the touch mode and from these at times selects electrode segment groups Z1 . . . Z5 and S1 . . . S9. These electrode segment groups Z1 . . . Z5 and S1 . . . S9 are connected to an interpretation system. By means of this interpretation system the distance, i.e. the Z position of the finger or of the hand of a user may be detected by the OLED interface. In this connection the detection is based on a change of the capacitive coupling against ground, the coupling of an electric potential, and/or the change of the dielectric characteristics of the environment of the electrode groups as a result of the penetration and positioning of the finger or of the hand in an area in front of the OLED interface. The influencing of the dielectric characteristics of the environment of the electrode segment groups Z1 . . . Z5 and S1 . . . S9 by the user may be detected by means of the electrode groups operated temporarily as sensor electrodes using different measurement approaches. A Typical measurement concept is that, for example, the coupling of the activated electrode segment group against ground influenced by the finger of the user is detected as an analog level, i.e. level varying within a range.

Figure 5:
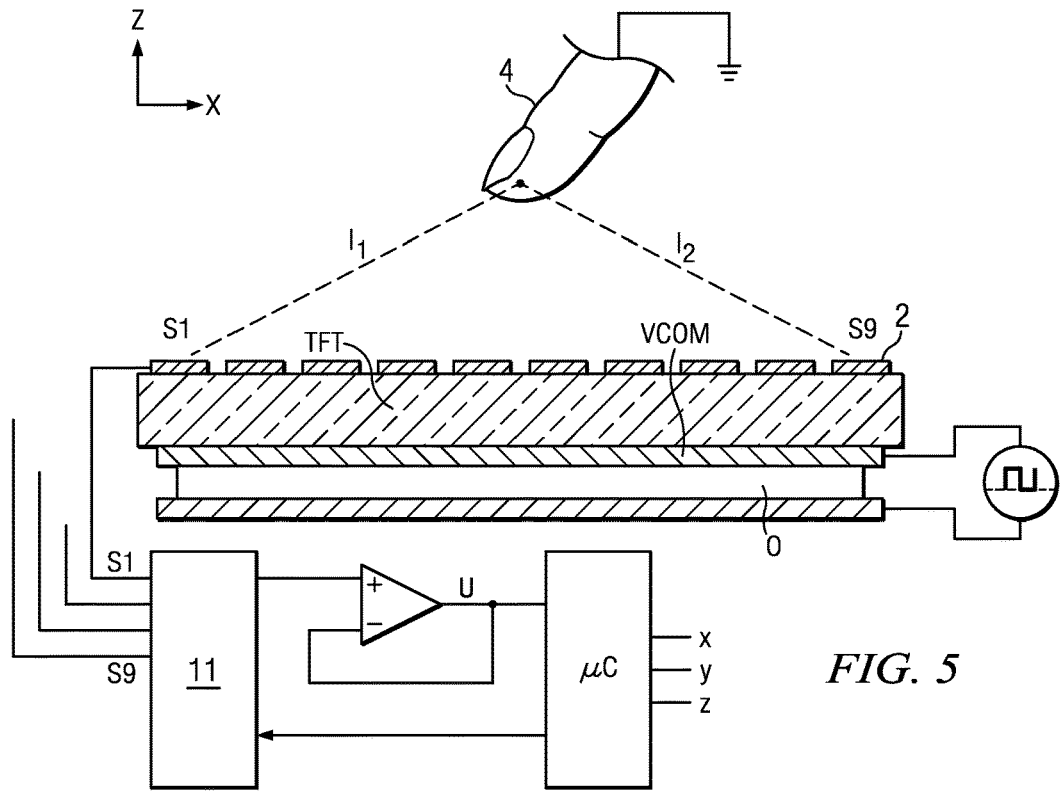
FIG. 5 shows a drawing for illustrating the determination of a X coordinate by means of trilateration of the voltage levels detected by means of the left and right segment columns.

Further illustrated in FIG. 5 in form of a drawing is an OLED interface according to various embodiments and the detection of the position of a finger of a user carried out therewith. By means of the electrode segments 2 located closely to the edge regions and combined into segment columns S1 and S9 signal levels are detected that are indicative for the distances 11, 12 of the fingertip 4 of the user of the OLED interface. Then, from these signal levels the X position and the Z distance are calculated. The level detection is carried out via a group driver, which consecutively connects certain electrode segment groups of the display device with an interpretation circuitry. By means of the amplifier illustrated in a simplified manner the voltage level is detected at the electrode group in a high-resistance manner and is transferred to the μC. It comprises an ADC and calculates the X, Y and Z coordinates of the fingertip 4 from the digital level information such derived. The electrode segments 2 are arranged on a panel layer, which is part of a TFT display structure. The TFT display structure comprises a VCOM electrode (VCOM) that directly acts as anode electrode or where applicable also as cathode of the OLED structure O. The OLED structure O, the TFT structure TFT and the upper sensor electrode array are constructed in layers. The OLED structure O and the TFT structure TFT share a transparent electrode layer as VCOM electrode or as anode electrode of the OLED structure. The TFT structure also may be designed as a simple LCD structure.

Applied to the electrodes of the OLED structure O is an alternating voltage which here is simplified shown as a square wave voltage without reversal of electric potential. The circuitry device comprises RX and TX connections. It is feasible, for example by means of respective channel multiplex, to utilize a plurality of electrode segment chains for contactless position detection. The interpretation of the signal levels present at the respective electrode segment chains in the non-touch mode may be carried out such that a multi object detection, i.e. for example the detection of two fingertips and a respective position detection are carried out.

Figure 6:
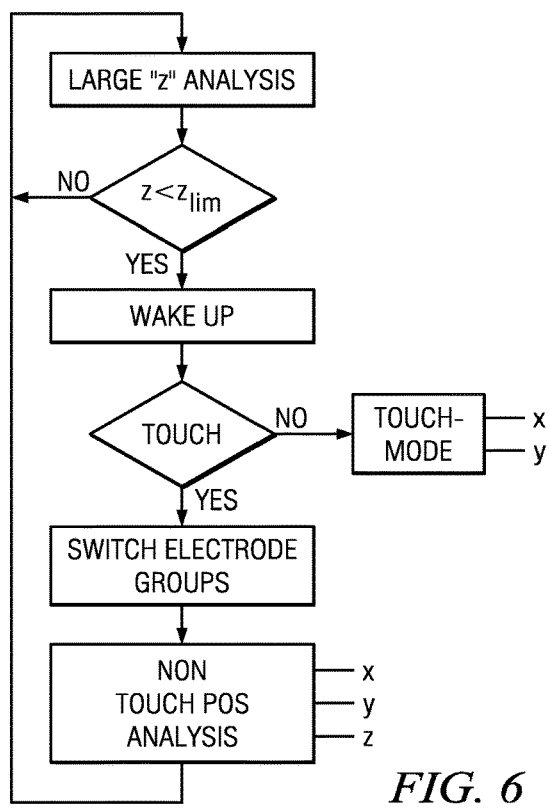
FIG. 6 shows a flow chart for describing a simple option of the position determination method according to various embodiments.

Illustrated in FIG. 6 is a simplified flow chart. As can be seen, at first it is inspected whether a certain minimum distance to the OLED interface is underrun. If this is true, the system is switched from a simple energy saving operation mode into a main operation mode. When a touch state is detected, a detection of the point of contact is carried out by means of the electrode segment array. This touch mode is held until the contact is interrupted. As soon as the finger of the user is lifted from the OLED interface it is checked whether a certain distance limit of, for example, about 66% of the interface diagonal is not exceeded. If this distance limit is not exceeded the detection system works in the non-touch mode in which consecutively activated electrode segment rows Z1 . . . Z5 and electrode segment columns S1 . . . S9, or only the electrode segment groups located close to the edge region, i.e. the electrode segment rows Z1 and Z5, as well as the electrode segment columns S1 and S9 of the electrode segment array are evaluated with respect to their capacitive coupling against ground. From the analog values dependent on the current position of the finger the X, Y and Z positions of the finger may be calculated.

The technique according to various embodiments in an advantageous manner may be realized as a OLED panel element that is provided with touchscreen electrodes, wherein these touchscreen electrodes are connected to an interpretation circuitry. The panel element then may be integrated into a display. At the side facing towards the user the electrodes of the panel element preferably again are covered by an isolating transparent covering layer, so that also in the touch mode no galvanic contacting of the electrode segments is carried out.

The technique according to various embodiments in particular is suitable for mobile communications devices such as cell phones, e-books and tablet PCs.

The electrode segments of the electrode array may be integrated into a transparent multi-layer panel structure. In order to accomplish a particularly reliable isolation of the crossing bridging points between the single electrode segments, the electrode segments that constitute electrode segment rows may be arranged on a first side of a transparent and isolating layer and the electrode segments that are connected into electrode segment columns—therefore extend transverse with respect to the rows—may be arranged on a averted side of this layer, or also be arranged on a further layer. Furthermore, on the side of this sandwich structure later averted from the user a substantially full area backside shielding layer may be formed. This backside shielding layer in particular also may be formed by the so-called VCOM layer of a liquid crystal structure. This in turn preferably acts as electrode of the OLED structure.

According to various embodiments, in an OLED interface, which provides touchscreen functionality as well as also non-touch position analysis functionalities, these functionalities are realized by means of jointly used electrode segments. The concept according to various embodiments may also be applied to flat structures, which directly cover a display. These flat structures may be used to realize at least temporarily illuminated touchpads, which in addition also allow for a contactless position detection. Such touchpads may be integrated into locations thus far traditional for touchpads, for example in notebooks. The structure according to various embodiments for combined detection of finger positions in the touch mode as well as also in the non-touch mode also may be integrated into other equipment, in particular furniture and vehicle interior in order to realize here in a spatially limited area a respective temporarily illuminated input zone, i.e. an input zone which also allows for non-touch interactions.

What is claimed is:

1. OLED interface, comprising:
a panel layer,
an OLED display arranged on a first side of the panel layer, comprising:
an anode-electrode layer,
a cathode-electrode layer, and
an organic illuminant layer structure that is arranged between the anode-electrode layer and the cathode-electrode layer, wherein the OLED display is configured to be operated by an alternating DC voltage fed between the anode-electrode layer and the cathode-electrode layer, wherein said alternating DC voltage generates an electric field;
an electrode layer arranged on a second side of the panel layer comprising a plurality of electrodes configured to detect said electric field; and
an interpretation circuitry coupled with the electrodes of the electrode layer and configured to, in interaction with at least the anode-electrode layer and/or the cathode-electrode layer:
in a contactless detection mode, detect a finger or a hand of a user in an area in front of the panel layer without that, or before, the user touches the electrode layer covering the OLED display by detecting disturbances in the electric field caused by the finger or hand entering said electric field; and in a contact detection mode exclusive of the contactless detection mode, detect a finger or a hand of a user onto the electrode layer covering the OLED display.

2. OLED interface of claim 1, wherein the voltage levels are
determined for a sensor electrode and are used for the calculation of a position of the finger or hand.

3. OLED interface of claim 2, wherein trilateration is performed on the voltage levels to determine coordinates of said finger or hand.

4. OLED interface, comprising:
a panel layer,
an OLED layer structure arranged on one side of the panel layer and configured to be operated by an alternating DC voltage, and
a transparent electrode layer arranged on the other side of the panel layer,
wherein the electrode layer is subdivided into a plurality of electrode segments and the electrode segments in a connection form a segment array that comprises segment rows and segment columns,
an interpretation circuitry coupled with the electrode segments and configured to:
in a contactless detection mode, detect a contactless position or movement detection of a finger of a user in an area in front of the panel layer by detecting disturbances in the electric field caused by the finger or hand entering said electric field, wherein the contactless position or movement detection is carried out using a combination of several electrode segments of the segment array into a row-like or column-like electrode segment group; and
in a contact detection mode exclusive of the contactless detection mode, detect a contact of a finger of the user onto a front of the panel layer.

5. OLED interface of claim 4, wherein the interpretation circuitry is formed such that it is configured to adopt a circuitry state in which a contact detection is carried out via the electrode segments of the electrode layer.

6. OLED interface of claim 5, further comprising a multiplexer configured to switchover the interpretation circuitry between the circuitry state for position detection at contact and a switching state for position or movement detection without contact.

7. OLED interface of claim 6, wherein a portion of a cycle for adopting an operational state for position or movement detection without contact is set to zero, or is reduced, as long as a contact is detected.

8. OLED interface of claim 6, wherein a portion of a cycle for adopting an operational state for position detection is reduced at contact to the interface as long as no contact is detected.

9. OLED interface of claim 6, wherein when the multiplexer device has carried out the switchover such that the OLED interface is in the switching state, a subset of the combination of several electrode segments is configured to carry out a more sensitive position detection upon detection of a coarse approach detection from a sufficiently pronounced approach state.

10. OLED interface of claim 6, wherein when the multiplexer device has carried out the switchover such that the OLED interface is in the switching state, varying electrode segment groups are configured as sensor electrodes.

11. OLED interface of claim 6, wherein when the multiplexer device has carried out the switchover such that the OLED interface is in the switching state, an electrode segment group is configured to initiate detection, the electrode segment comprising an upper horizontal segment chain.

12. OLED interface of claim 6, wherein when the multiplexer device has carried out the switchover such that the OLED interface is in the switching state, an electrode segment is configured to initiate detection, the electrode segment comprising a left vertical segment chain.

13. OLED interface of claim 6, wherein when the multiplexer device has carried out the switchover such that the OLED interface is in the switching state, an electrode segment is configured to initiate detection, the electrode segment comprising a right vertical segment chain.

14. OLED interface of claim 6, wherein when the multiplexer device has carried out the switchover such that the OLED interface is in the switching state, the interpretation circuitry is configured to determine a X and Y position level at least from electrode segment groups oriented transverse to each other.

15. Display device comprising an OLED interface of claim 6, wherein the electrode segment groups used for the detection of the position of the finger in the non-touch mode are interchanged consecutively such that the respective active electrode segment group in the manner of a running row or a running column migrates across the interface.

16. Display device comprising an OLED interface according to claim 6, wherein:
in the context of a switching state intended for position or movement detection without contact, the display device includes two electrode segment groups; and
the interpretation circuitry is further configured to detect capacitive coupling of the two electrode segment groups and, from the capacitive coupling, determine the approach state.

17. The OLED interface of claim 14, wherein the electrode segment groups are oriented perpendicular to each other.

18. OLED interface, comprising:
a support layer,
an electrode layer that is connected to one side of the support layer, and
an OLED function layer arranged on an opposite side of the one side of the support layer,
wherein the electrode layer is subdivided into a plurality of electrode segments and the electrode segments in a connection form a segment array that comprises segment rows and segment columns,
an interpretation circuitry configured to:
perform a contact circuitry state in which via the electrode segments of the electrode layer a contact detection is carried out, and
perform a contactless circuitry state, exclusive of the contact circuitry state by detecting a disturbance in an electric field generated by an alternating DC voltage fed to the OLED function layer, wherein an object entering said electric field causes said disturbance in the electric field,
wherein:
the interpretation circuitry is configured to perform the contactless position or movement detection by combining several electrode segments of the segment array to a row-like or column-like electrode segment group.

19. Method for producing input signals in connection with the movement of a finger of a user on a touchpad component, wherein the touchpad component comprises a OLED layer structure, a support layer, and an electrode layer that is connected to the support layer, wherein the electrode layer is subdivided into a plurality of electrode segments and the electrode segments in a connection form a segment array that comprises segment rows and segment columns, and the interpretation of the signals detected via the segment rows and segment columns is carried out by an interpretation circuitry, comprising, in the interpretation circuitry:

performing a contact circuitry state in which the electrode segments of the electrode layer detect contact with a surface of the touchpad component;

performing a contactless circuitry state in which contactless position or movement detection of a finger of a user in front of the touchpad component by combining several electrode segments of the segment array to a row-like or column-like electrode segment group and by a coupling potential of an alternating DC voltage fed to the OLED layer structure;

selectively entering either the contact circuitry state or the contactless circuitry state to detect either contact or proximity.

20. The method of claim 19, further comprising pulse width modulating said alternating DC voltage.

\* \* \* \* \*